(12) United States Patent
Lee (10) Patent No.: US 6,759,679 B2
(45) Date of Patent: Jul. 6, 2004

(54) POLY-SILICON LAYER OF A THIN FILM TRANSISTOR AND DISPLAY DEVICE HAVING THE SAME

(75) Inventor: Ki-Yong Lee, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/173,977

(22) Filed: Jun. 19, 2002

(65) Prior Publication Data

US 2003/0102508 A1 Jun. 5, 2003

(30) Foreign Application Priority Data

Nov. 27, 2001 (KR) ........................................ 2001-74375

(51) Int. Cl.[7] .............................................. H01L 29/76
(52) U.S. Cl. ............................ 257/66; 257/72; 257/347; 257/64
(58) Field of Search ............................ 257/66, 72, 347, 257/64

(56) References Cited

U.S. PATENT DOCUMENTS

| 5,498,904 | A | * | 3/1996 | Harata et al. .................. 257/64 |
| 5,656,825 | A | * | 8/1997 | Kusumoto et al. ............. 257/66 |
| 6,177,301 | B1 | | 1/2001 | Jung ............................ 438/150 |
| 6,177,391 | B1 | * | 1/2001 | Zafar .......................... 510/131 |
| 6,426,246 | B1 | * | 7/2002 | Chang et al. ................ 438/166 |
| 6,521,473 | B1 | * | 2/2003 | Jung ............................ 438/30 |

OTHER PUBLICATIONS

WO 97/45827; Dec. 4, 1997; International Application Published Under The Patent Cooperation Treaty (PCT).

* cited by examiner

*Primary Examiner*—Mark V. Prenty
(74) *Attorney, Agent, or Firm*—Staas & Halsey LLP

(57) ABSTRACT

A poly-silicon layer of a thin film transistor (TFT) having an active channel region, wherein a probability P that a maximum number of a primary grain boundary exists on the active channel region is not 0.5, the probability obtained by the following equation:

$$P = \frac{D - (N\max - 1) \cdot Gs}{Gs},$$

where $D = L \cos \theta + W \sin \theta$, L is a channel length of the active channel region, W is a width of the active channel region, Nmax is the maximum number of the primary boundary existing on the active channel region, Gs is a grain size, and $\theta$ is a tilt angle of the primary grain boundary and the display device having thereof.

36 Claims, 11 Drawing Sheets

POLY-SILICON LAYER OF A THIN FILM TRANSISTOR AND DISPLAY DEVICE HAVING THE SAME

CROSS-REFERENCE TO THE RELATED APPLICATIONS

This application claims the benefit of Korean Application No. 2001-74375, filed Nov. 27, 2001 in the Korean Industrial Property Office, the disclosure of which is incorporated herein by reference.

BACKGROUND OF THE INVENTION

1. Field of the Invention

The present invention relates to a poly-silicon layer and a device having the same, and more particularly, to a poly-silicon layer of a thin film transistor (TFT) and a device having the same.

2. Description of Related Art

An active channel region of a thin film transistor (TFT) is generally made of a poly-silicon material and so includes grain boundaries. In the grain boundaries, defects such as dangling bonds and strained bonds exist, and such defects act as traps of the charge carriers.

Therefore, parameters such as grain size, grain-size uniformity, number of grains, locations of grain boundaries, and tilt angle of grain boundaries affect characteristics of the TFT such as threshold voltage, sub-threshold slope, charge carrier mobility, leakage current, and device stability. In particular, the tilt angle of the grain boundaries affects uniformity in characteristics of the TFTs.

Figure 1:
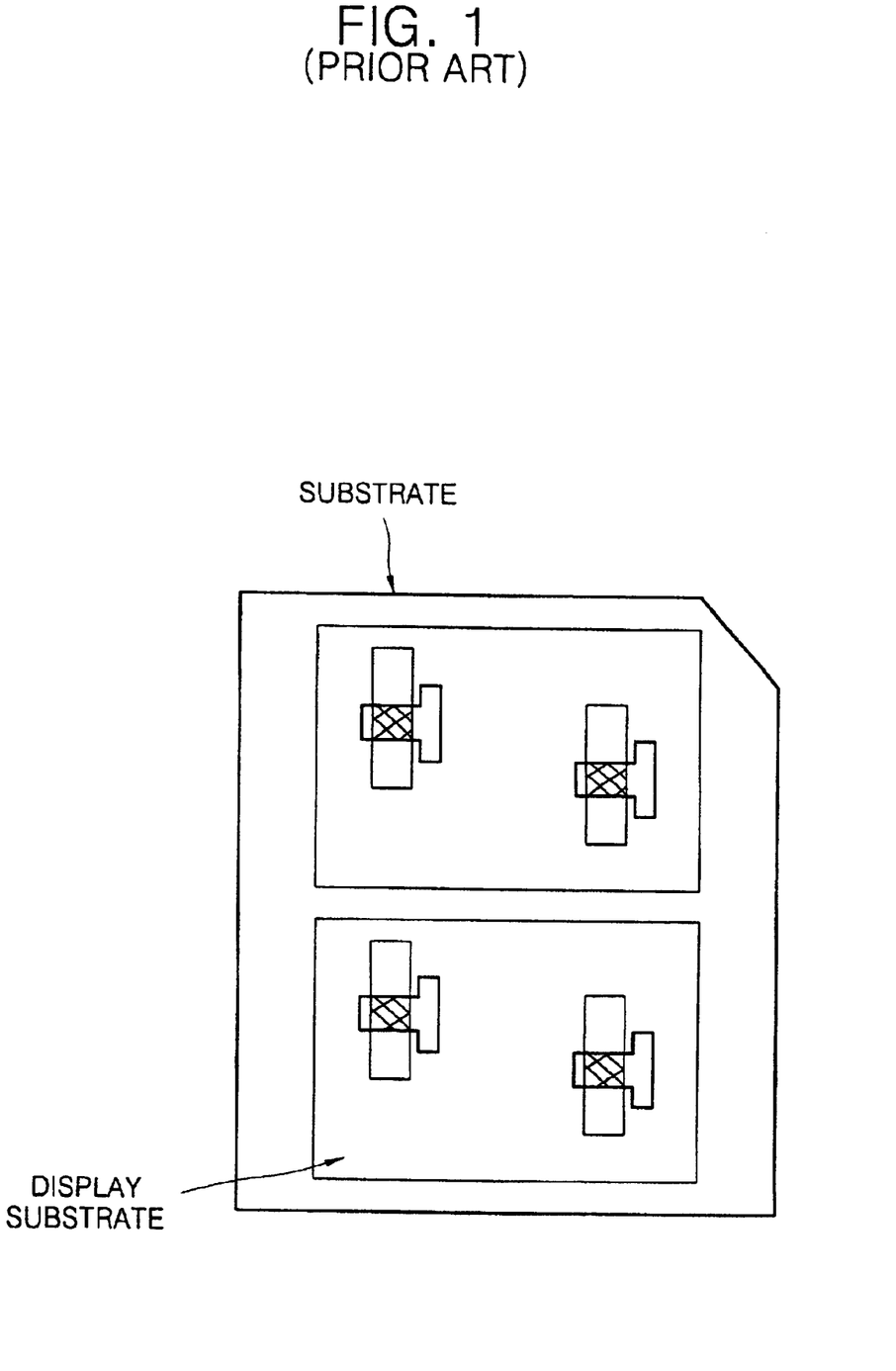
FIG. 1 illustrates that the number of primary boundaries existing on an active channel region depends on a size of a grain and a tilt angle of a grain boundary and a dimension of an active channel region according to the conventional art.

The grain boundary which adversely affects characteristics of the TFT is referred to as a primary boundary. The number of the primary boundaries existing on the active channel region depends on a grain size and a tilt angle "θ" of a grain boundary and a dimension (i.e., length L and width W) of the active channel region, as illustrated in FIG. 1.

Assuming that the maximum number of the primary grain boundaries which can exist on the active channel region with a given channel length is "Nmax", the number of the primary grain boundaries existing on an arbitrary active channel region with the same channel length can be either "Nmax" or "Nmax−1".

Figure 2A:
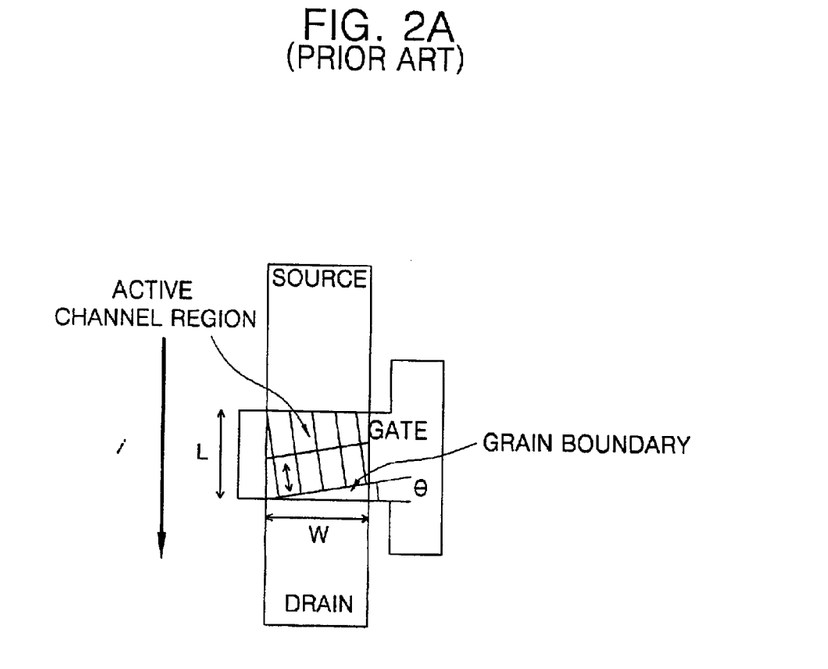
FIGS. 2A and 2B illustrate TFTs having different numbers of primary boundaries according to the conventional art.
Figure 2B:
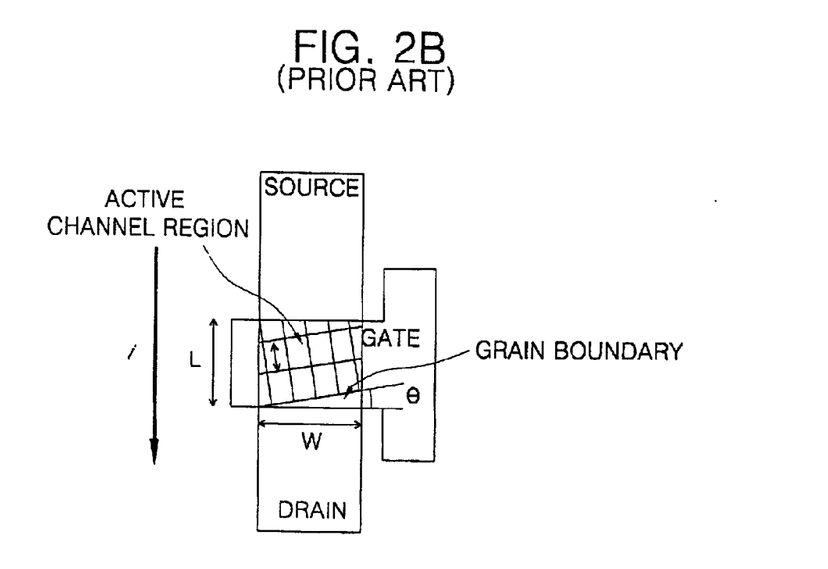

Referring to FIGS. 2A and 2B, the TFT of FIG. 2A has two primary boundaries, and the TFT of FIG. 2B has three primary boundaries.

In a display device, as the TFTs having the same number of primary boundaries become more dominant, the display device having an excellent TFT characteristic uniformity can be achieved. However, when the TFTs having Nmax primary-boundaries and the TFTs having "Nmax−1" primary-boundaries are equal in number, the display device has a worst uniformity in TFT characteristics.

Meanwhile, the active channel region having large silicon grains can be formed using a sequential lateral solidification (SLS) technique. The TFT manufactured by employing such an active channel region shows similar characteristics to those of the TFT manufactured by using a single crystalline silicon.

However, a display device includes millions of pixels. A liquid crystal display (LCD) device includes one TFT per one pixel, and an organic electroluminescent (EL) display device includes at least two TFTs per one pixel. Therefore, it is impossible to manufacture millions of TFTs that are all equal in number of the primary grain boundaries existing on the active channel region and in the grain growth direction.

Figure 3A:
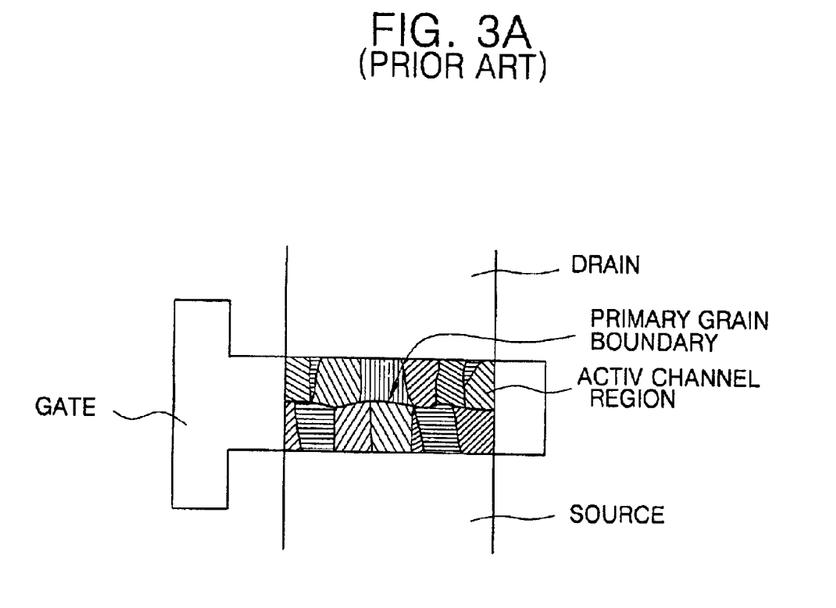
FIGS. 3A and 3B illustrate TFTs having an active channel having large silicon grains formed by an SLS technique according to the conventional art.
Figure 3B:
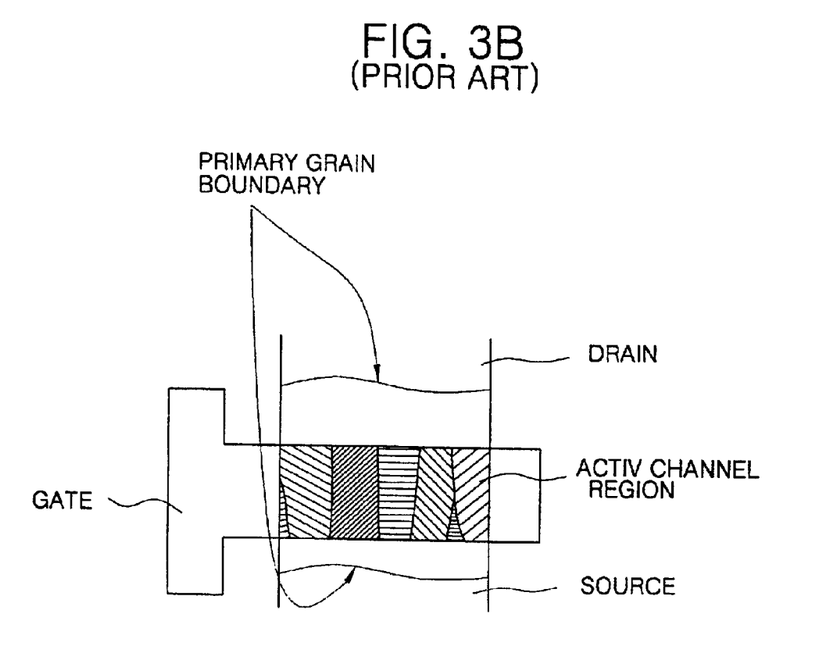

International Patent No. WO 97/45827 discloses a technique to form an active channel region having large silicon grains using the SLS technique. An amorphous silicon layer is deposited using a PECVD technique, an LPCVD technique, or a sputtering technique. Thereafter, the entire portion or a selected portion of the amorphous silicon layer is crystallized using the SLS technique, as illustrated in FIGS. 3A and 3B.

During a crystallization of the entire portion or a selected portion of the amorphous silicon layer, a laser beam or a stage can be stepped up or down, or shifted. Therefore, a misalignment between regions scanned by the laser beam occurs, resulting in a different number of primary grain boundaries in the active channel region from TFT to TFT. Although there is no misalignment error on the entire panel during crystallization, there would always be a different number of the primary boundaries from TFT to TFT depending on the position and dimension of TFTs on the panel unless the position and dimension of TFTs are designed to control the number and position of the primary grain boundaries, which complicates both the TFT design and the fabrication process. Thus, the number of primary grain boundaries included in the active channel region of the individual TFTs can differ from each other, leading to bad uniformity in TFT characteristics.

Figure 4A:
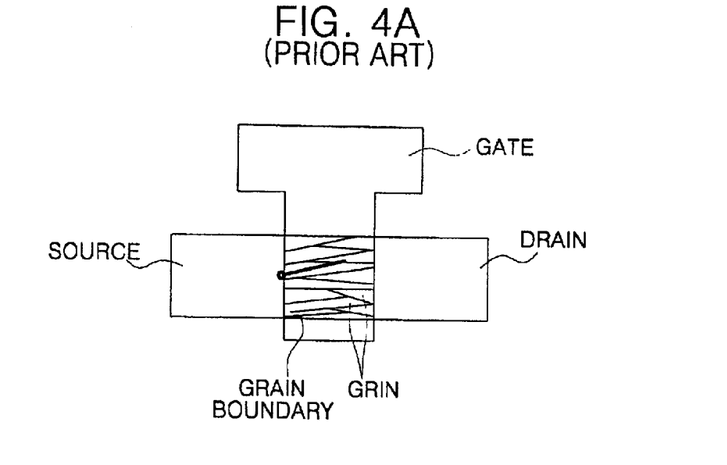
FIGS. 4A to 4C are cross-sectional views illustrating active channel regions of TFTs according to the conventional art.
Figure 4B:
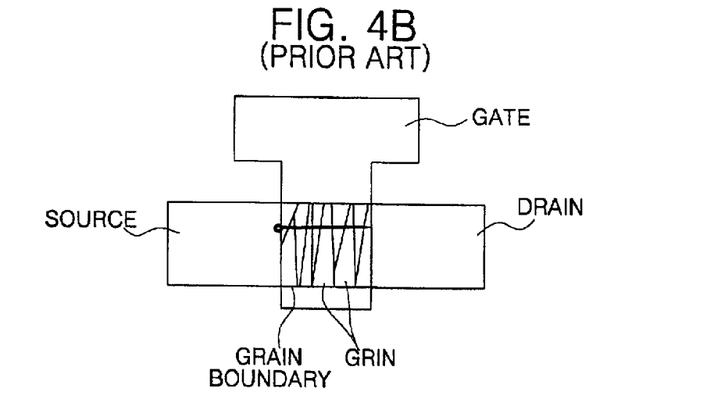
Figure 4C:
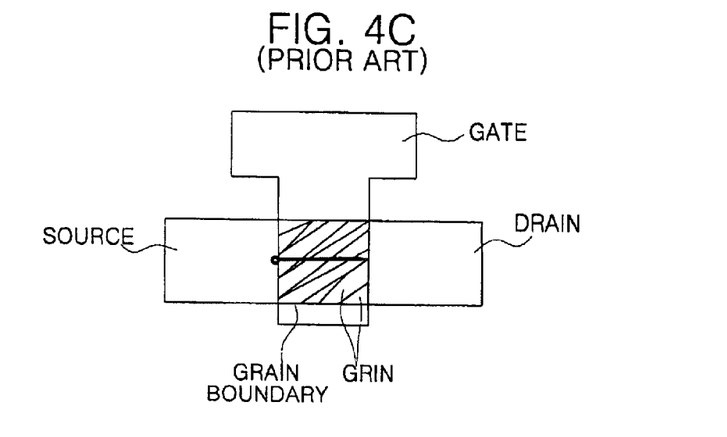

U.S. Pat. No. 6,177,301 discloses a method of manufacturing a TFT, wherein the active channel region of the TFT having large silicon grains is formed using the SLS technique. When a channel direction is parallel to a grain growth direction, as illustrated in FIG. 4A, a barrier effect of the grain boundary for a charge carrier direction is minimized, whereupon the TFT can have a characteristic similar to the single crystalline silicon. However, when a channel direction is perpendicular to a grain growth direction, as illustrated in FIG. 4B, the grain boundaries act as a trap of the charge carriers, whereupon a characteristic of the TFT greatly deteriorates.

Actually, the TFTs of which channel direction is perpendicular to a grain growth direction can be manufactured. In this case, a characteristic uniformity of the TFTs can be improved without greatly lowering the characteristics of the TFTs by tilting an angle of a channel direction to a grain growth direction by 30° to 60°. However, this method cannot remove the primary boundaries completely from the active channel region, and thus the non-uniformity in the TFT characteristics due to the differing number of the primary grain boundaries still exists.

SUMMARY OF THE INVENTION

Accordingly, it is an object of the present invention to provide a poly-silicon layer which can provide thin film transistors having uniform characteristics.

It is another object of the present invention to provide a display device having uniform characteristics.

Additional objects and advantages of the invention will be set forth in part in the description which follows and, in part, will be obvious from the description, or may be learned by practice of the invention.

The foregoing and other objects of the present invention are achieved by providing a poly-silicon layer of a thin film transistor (TFT) comprising an active channel region, wherein a probability P that a maximum number of a primary grain boundaries exist on the active channel region is not 0.5, the probability obtained by the following equation:

$$P = \frac{D - (N\max - 1) \cdot Gs}{Gs},$$

where D=L cos θ+W sin θ, L is a channel length of the active channel region, W is a width of the active channel region, Nmax is the maximum number of the primary boundaries existing on the active channel region, Gs is a grain size, and θ is a tilt angle of the primary grain boundary.

The foregoing and other objects of the present invention are also achieved by providing a poly-silicon layer of a thin film transistor (TFT) comprising an active channel region, wherein a length of the active channel region is an integer multiple of a grain size.

The foregoing and other objects of the present invention are also achieved by providing a poly-silicon layer of a thin film transistor (TFT) comprising an active channel region, wherein a probability that a maximum number of primary grain boundaries exists on the active channel region is defined as a ratio of the distance in which the length of the active channel in the longitudinal direction of grains minus a distance that a "maximum number—1" of primary grain boundaries occupy, to the longitudinal length of the grains, and the probability is not 0.5.

The foregoing and other objects of the present invention are also achieved by providing a device having a thin film transistor having the poly-silicon layer of one of the poly-silicon layers of the present invention.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF PREFFERED EMBODIMENTS

Reference will now be made in detail to the embodiments of the present invention, examples of which are illustrated in the accompanying drawings, wherein like reference numerals refer to like elements throughout. The embodiments are described below in order to explain the present invention by referring to the figures.

In order to determine an optimum condition of parameters such as a size of a silicon grain, a tilt angle of a primary grain boundary, and a dimension of an active channel region, and in order to manufacture thin film transistors (TFTs) having uniform characteristics, a probability P that Nmax primary boundaries exists on the active channel region is drawn as a function of a grain size, a tilt angle of the grain boundary, and a dimension of the active channel region.

Figure 5A:
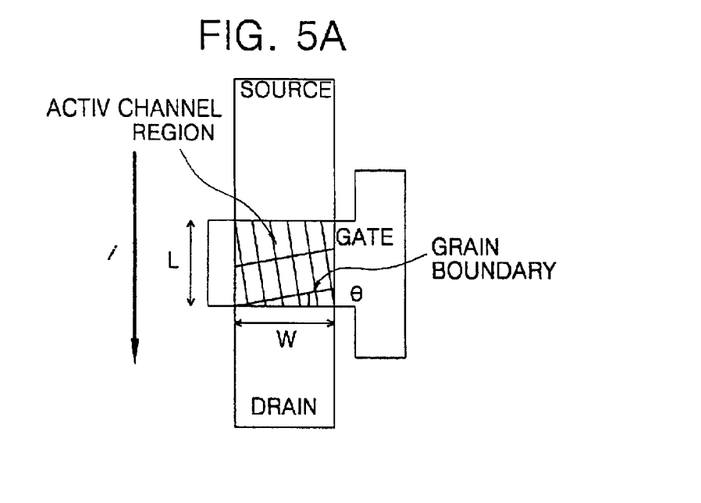
FIGS. 5A to 5C show cross-sectional views illustrating active channel regions of TFTs having tilted primary grain boundaries according to the present invention.
Figure 5B:
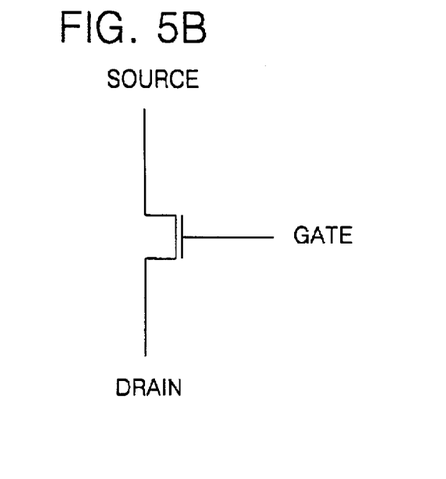
Figure 5C:
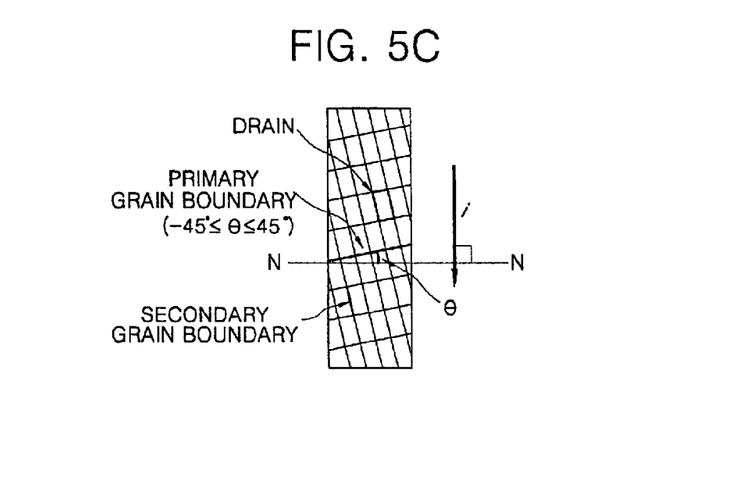

Referring to FIGS. 5A to 5C, an angle "θ" formed by the primary boundary and an imaginary normal line NN between the source and the drain electrodes is in a range between −45° and 45°. That is, "−45°≦θ≦45°" is valid.

Figure 6A:
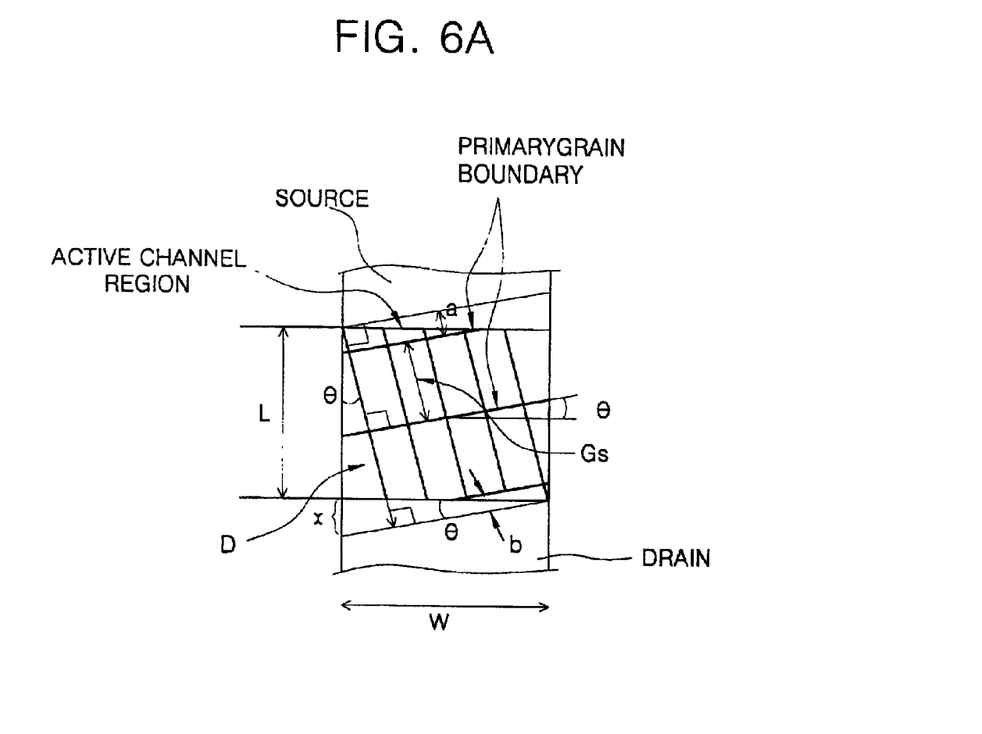
FIGS. 6A and 6B are views describing an equation to obtain a probability that a maximum-number of or a maximum number—1 of tilted primary grain boundaries exist on the active region according to the present invention.
Figure 6B:
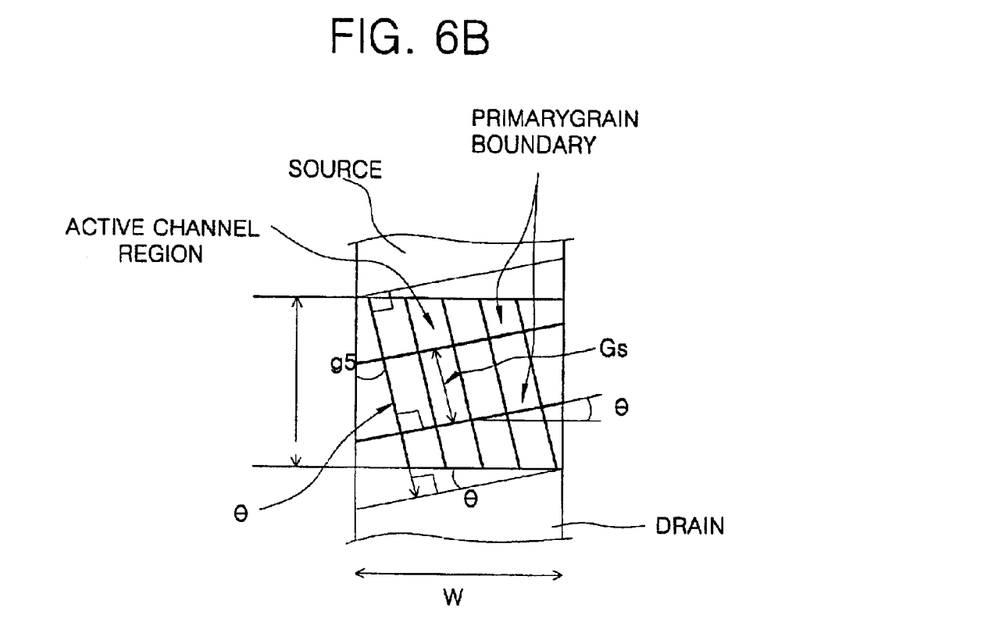

Referring to FIGS. 6A and 6B, assume that a length and a width of the active channel region are L and W, and a distance between two imaginary lines that extend from two angular points of the active channel region, are parallel to the primary grain boundary, and are perpendicular to a second grain boundary is D. Therefore, the following equation is valid:

$$D = (L+x) \times \cos\theta,$$

where "x" is "W×tan θ".

"D=(L+W tan θ)×cos θ=L cos θ+W tan θ cos θ" is valid. Since "tan θ cos θ" is "sin θ", "D" is "L cos θ+W sin θ".

Therefore, the distance D can be defined as a function of length L, width W, and tilt angle θ.

Assume that a longitudinal length of the grain is Gs. The maximum number Nmax of the primary boundaries existing on the active channel region can be defined as follows:

$$N\max = \xi(D/Gs).$$

Here, the function ξ can be defined as follows:

$$\xi(x) \text{ is the smallest integer among numbers} \geq x,$$

where "x" is an arbitrary number.

For example, when "x" is "2,", "Nmax" is "2," and when x is "2.3," "Nmax" is "3."

Meanwhile, a probability P that Nmax primary boundaries exist on the active channel region can be defined as follows:

$$P = \frac{a+b}{Gs}$$

where "a+b" is a distance that the distance D minus a distance that "Nmax−1" grains occupy: "a+b"=D−(Nmax−1)Gs.

Therefore, $$P = \frac{D - (N\max - 1) \cdot Gs}{Gs}.$$

Meanwhile, a probability Q that Nmax−1 primary boundaries exist on the active channel region can be defined as follows:

Since P+Q=1, Q=1−P.

Therefore, $$Q = 1 - \frac{D - (N\max - 1) \cdot Gs}{Gs} = \frac{-D + N\max \cdot Gs}{Gs}.$$

As described above, the active channel region of the TFT has Nmax primary boundaries or Nmax−1 primary boundaries. The probability has the following meaning.

P=0: a probability that Nmax primary boundaries exist on the active channel region is "0," and thus, Nmax−1 primary boundaries exist on the active channel region.

0<P<0.5: a probability that Nmax primary boundaries exist on the active channel region is lower than a probability that Nmax−1 primary boundaries exist on the active channel region.

P=0.5: a probability that Nmax primary boundaries exist on the active channel region is equal to a probability that Nmax−1 primary boundaries exist on the active channel region.

0.5<P<1: a probability that Nmax primary boundaries exist on the active channel region is higher than a probability that Nmax−1 primary boundaries exist on the active channel region.

P=1: a probability that Nmax primary boundaries exist on the active channel region is "1," and thus, the Nmax primary boundaries exist on the active channel region.

Consequently, when "P" is "0.5," the uniformity of the TFT characteristics is worst. Alternatively, when "P" is "0" or "1," the uniformity of the TFT characteristics is most excellent.

However, it is not easy to manufacture the poly-silicon layers having a probability of "0" or "1," for such a reason as, for example, due to a process margin during a wet or dry-etching of a gate metal. It is preferred that the poly-silicon layer is manufactured based on a probability of 0≦P≦0.25 or 0.75≦P≦1, which is a range of uniformity in the TFT characteristics required in the display device.

Figure 7A:
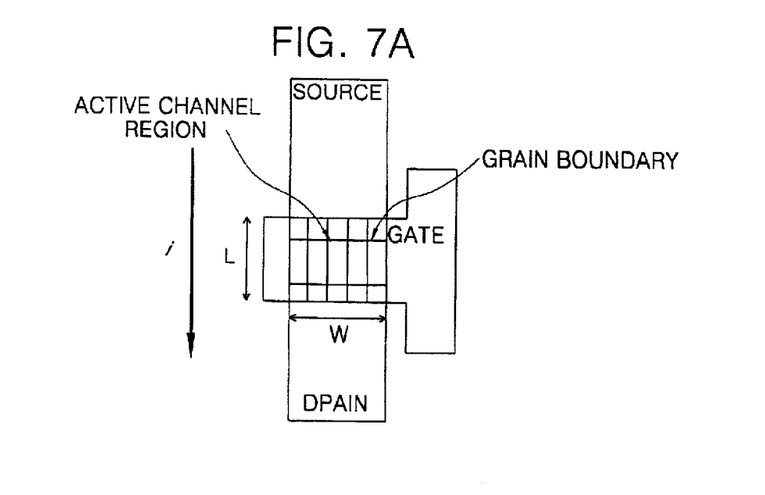
FIGS. 7A to 7C, 8A to 8B are views describing an equation to obtain a probability that a maximum-number of or a maximum number—1 of primary grain boundaries exist on the active region according to the present invention.
Figure 7B:
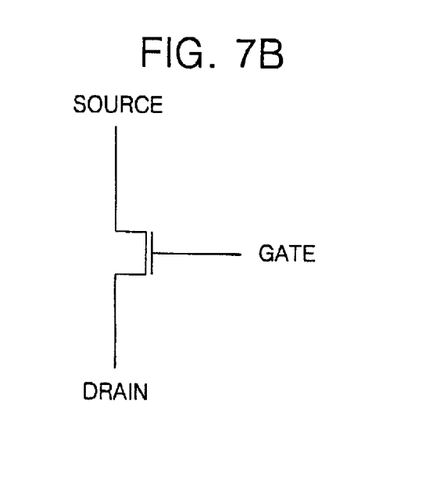
Figure 7C:
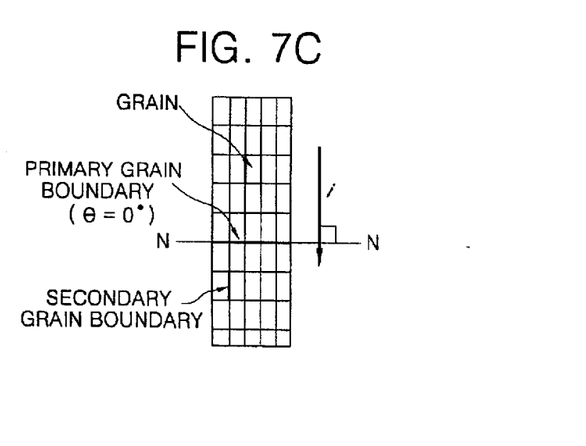

Referring to FIGS. 7A to 7C, the primary grain boundary is parallel to the imaginary normal line NN. That is, the tilt angle θ of the primary grain boundary is "0°." In this case, when the same number of primary grain boundaries exists on the active channel region, the effects of the secondary grain boundaries to the TFT characteristics are reduced in comparison to the case where the tilt angle θ is not "0°," and therefore it is understood that the TFT characteristics are improved.

Figure 8A:
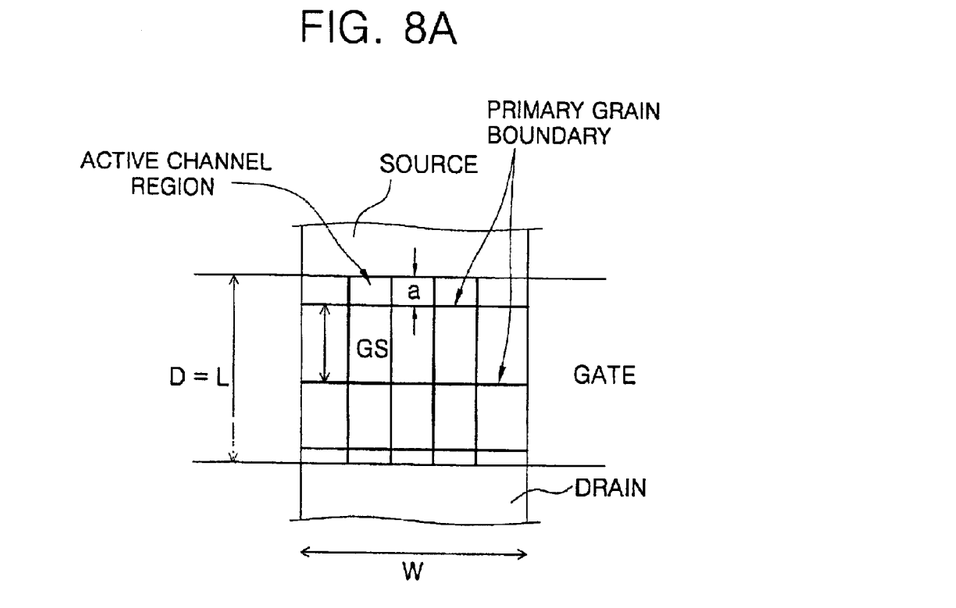
Figure 8B:
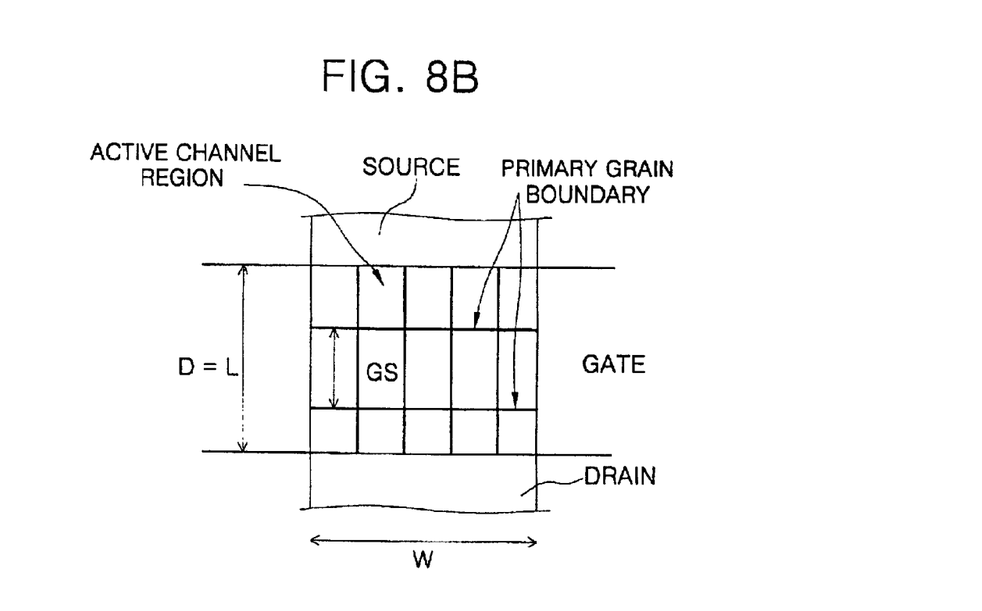

Referring to FIGS. 8A and 8B, in case where the tilt angle θ of the primary grain boundary is "0°," the distance D is equal to the length L, and thus the probability can be defined as follows:

$$P = \frac{L - (N\max - 1) \cdot Gs}{Gs}.$$

Also, the probability Q can be defined as follows:

$$Q = 1 - \frac{L - (N\max - 1) \cdot Gs}{Gs}$$
$$= \frac{-L + N\max \cdot Gs}{Gs}.$$

Figure 9A:
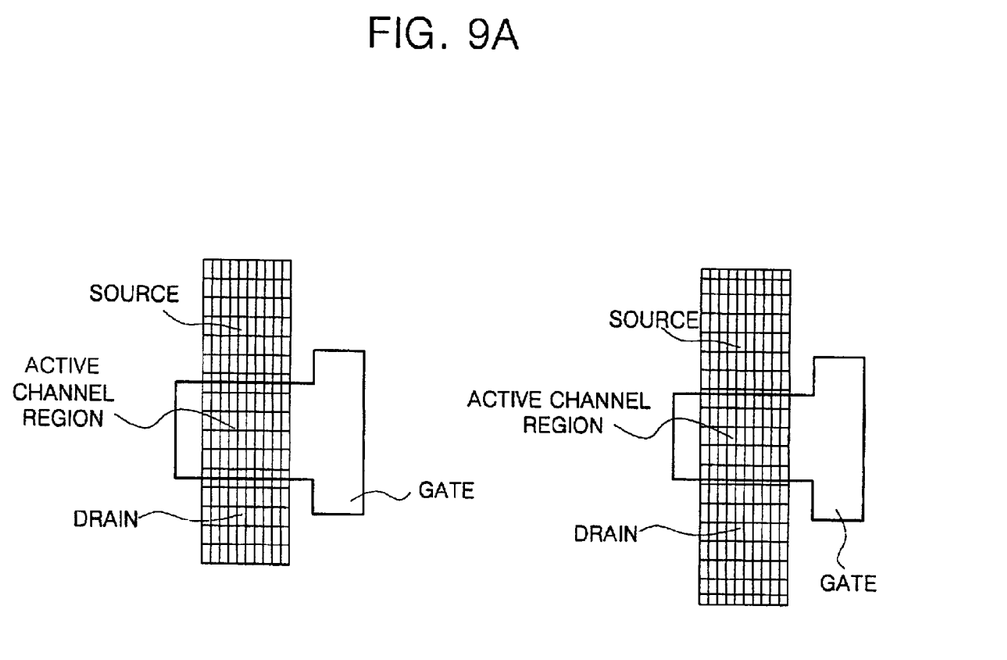
FIGS. 9A, 9B, 10A, 10B, 11A and 11B are views illustrating examples to obtain the probability by certain parameter values.

Referring to FIG. 9A, the length L is 9 μm, and a grain size Gs is 2 μm. In this case, Nmax is 5. Therefore, four or five primary grain boundaries exist on the active channel region of FIG. 9A. As a result, P and Q are 0.5, respectively. Therefore, it is understood that the uniformity of the TFT characteristics is worst.

Figure 9B:
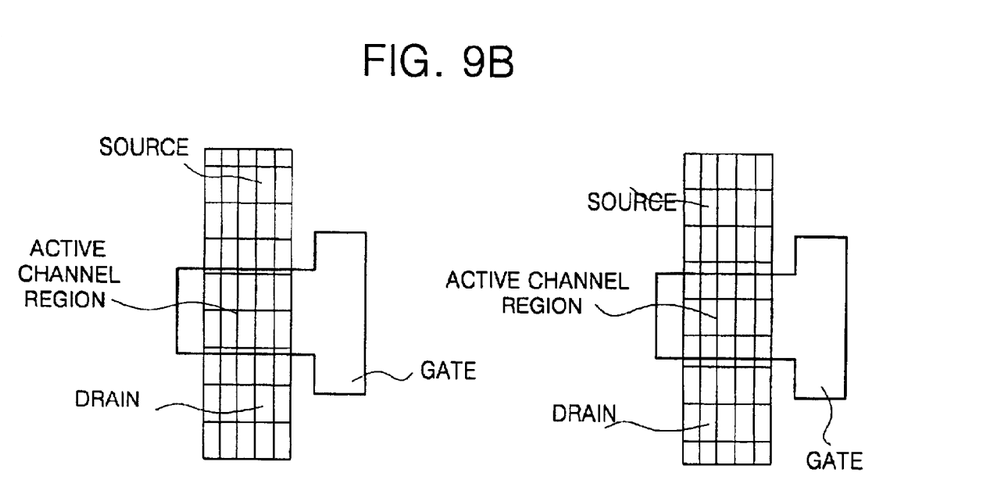

Referring to 9B, the length L is 9 μm, and a grain size Gs is 4 μm. In this case, Nmax is 3. Therefore, two or three primary grain boundaries exist on the active channel region of FIG. 9B. As a result, P and Q are 0.25 and 0.75, respectively. Therefore, it is understood that the uniformity of the TFT characteristics becomes improved in comparison to those having the active channel region of FIG. 9A.

Figure 10A:
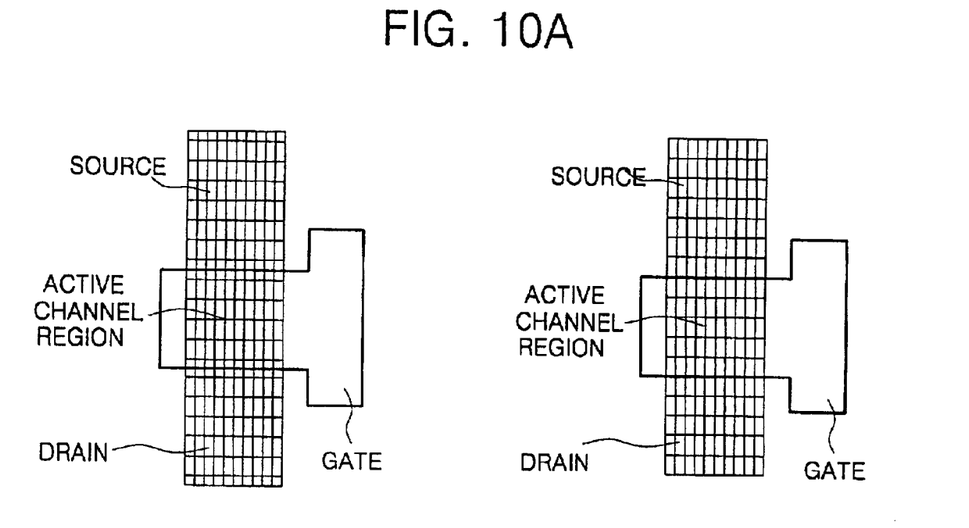

Referring to FIG. 10A, the length L is 10 μm, and a grain size Gs is 2 μm. In this case, Nmax is 5. Therefore, four or five primary grain boundaries exist on the active channel region of FIG. 10A. As a result, P and Q are 1 and 0, respectively. Therefore, it is understood that the uniformity of the TFT characteristics is optimal.

Figure 10B:
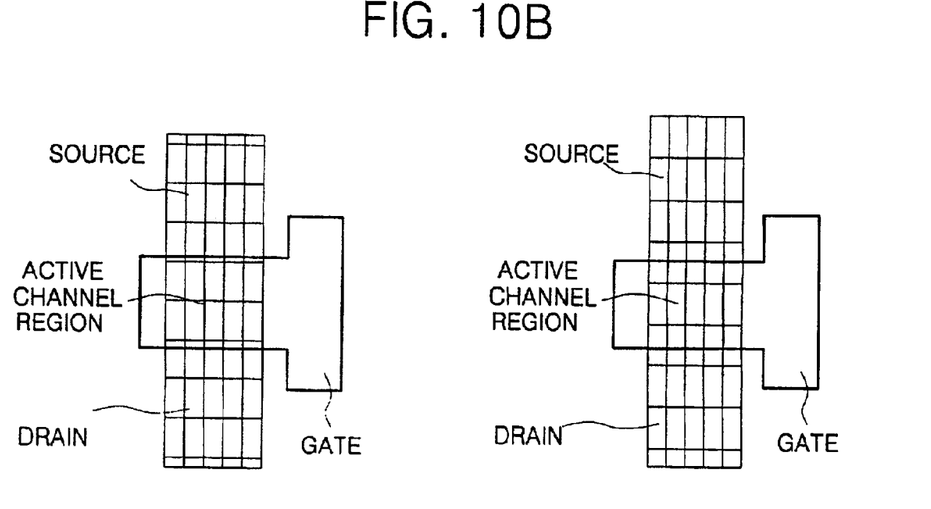

Referring to 10B, the length L is 10 μm, and a grain size Gs is 4 μm. In this case, Nmax is 3. Therefore, two or three primary grain boundaries exist on the active channel region of FIG. 10B. As a result, P and Q are 0.5 and 0.5, respectively. Therefore, it is understood that the uniformity of the TFT characteristics becomes poor in comparison to those having the active channel region of FIG. 10A.

Figure 11A:
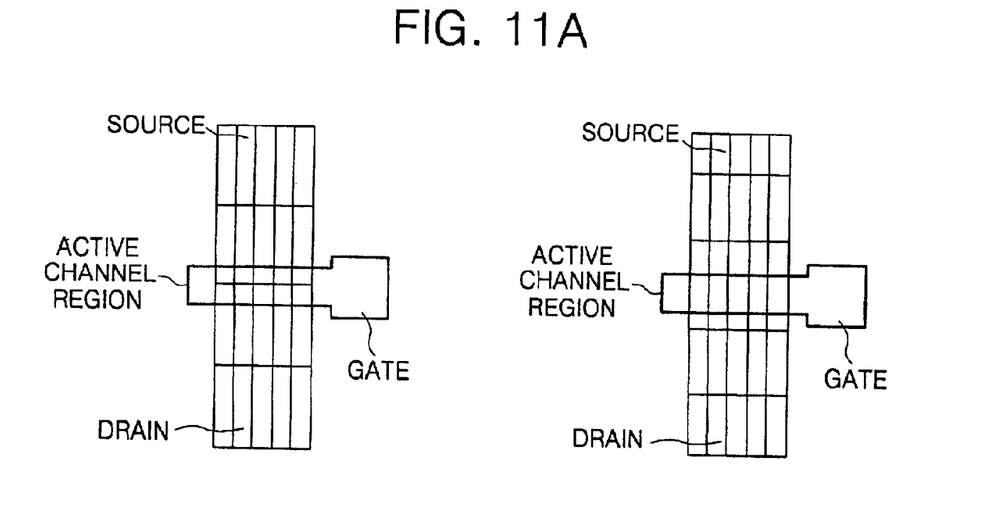

Referring to FIG. 11A, the length L is 4 μm, and a grain size Gs is 8 μm. In this case, Nmax is 1. Therefore, one or no grain boundaries exist on the active channel region of FIG. 1A. As a result, P and Q are 0.5, respectively. Therefore, it is understood that the uniformity of the TFT characteristics is worst.

Figure 11B:
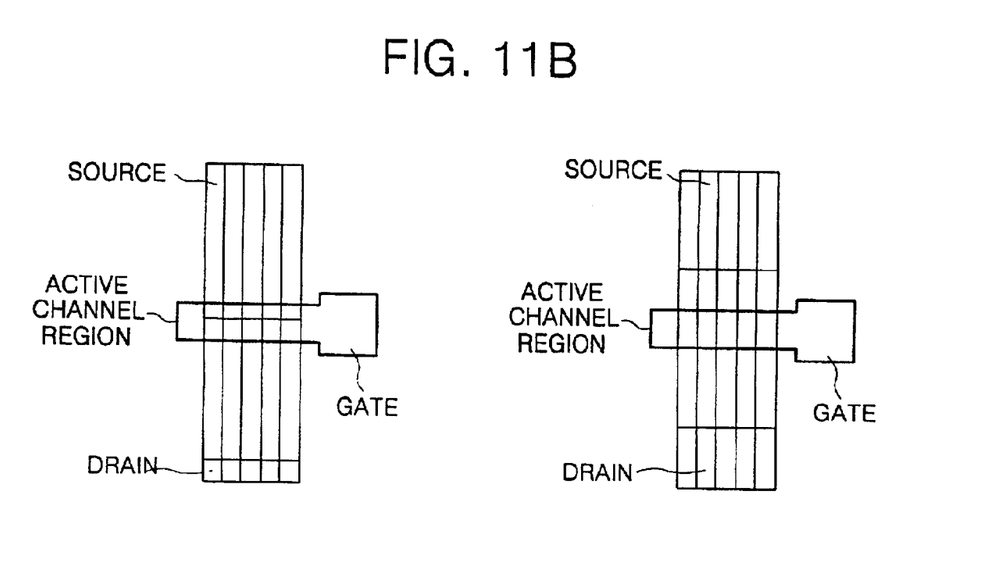

Referring to 11B, the length L is 4 μm, and a grain size Gs is 16 μm. In this case, Nmax is 1. Therefore, one or no primary grain boundaries exist on the active channel region of FIG. 11B. As a result, P and Q are 0.25 and 0.75, respectively. Therefore, it is understood that the uniformity of the TFT characteristics becomes improved in comparison to those having the active channel region of FIG. 11A.

As described above, the characteristic uniformity of the TFTs can be predicted by obtaining the probability that the primary grain boundaries exist on the active channel region. Therefore, process parameters of a silicon crystallization process are set to achieve the TFTs having an excellent uniformity.

The following Tables 1 to 4 illustrate the probability P according to a grain size and a dimension of the active channel region.

TABLE 1

| θ | Gs(μm) | L(μm) | Nmax | P | Gs(μm) | L(μm) | Nmax | P | Gs(μm) | L(μm) | Nmax | P |
|---|---|---|---|---|---|---|---|---|---|---|---|---|
| 2° | 0.4 | 1 | 3 | 0.778 | 1.5 | 1 | 1 | 0.741 | 2.5 | 1 | 1 | 0.444 |
|  |  | 2 | 6 | 0.277 |  | 2 | 2 | 0.407 |  | 2 | 1 | 0.844 |
|  |  | 3 | 8 | 0.777 |  | 3 | 3 | 0.074 |  | 3 | 2 | 0.244 |
|  |  | 4 | 11 | 0.277 |  | 4 | 3 | 0.741 |  | 4 | 2 | 0.644 |
|  |  | 5 | 13 | 0.778 |  | 5 | 4 | 0.407 |  | 5 | 3 | 0.044 |

TABLE 1-continued

| θ | Gs(μm) | L(μm) | Nmax | P | Gs(μm) | L(μm) | Nmax | P | Gs(μm) | L(μm) | Nmax | P |
|---|---|---|---|---|---|---|---|---|---|---|---|---|
|  |  | 6 | 16 | 0.277 |  | 6 | 5 | 0.074 |  | 6 | 3 | 0.444 |
|  |  | 7 | 18 | 0.777 |  | 7 | 5 | 0.740 |  | 7 | 3 | 0.844 |
|  |  | 8 | 21 | 0.277 |  | 8 | 6 | 0.407 |  | 8 | 4 | 0.244 |
|  |  | 9 | 23 | 0.776 |  | 9 | 7 | 0.074 |  | 9 | 4 | 0.644 |
|  |  | 10 | 26 | 0.276 |  | 10 | 7 | 0.740 |  | 10 | 5 | 0.044 |
| 5° | 0.4 | 1 | 4 | 0.193 | 1.5 | 1 | 1 | 0.852 | 2.5 | 1 | 1 | 0.511 |
|  |  | 2 | 6 | 0.692 |  | 2 | 2 | 0.518 |  | 2 | 1 | 0.911 |
|  |  | 3 | 9 | 0.191 |  | 3 | 3 | 0.184 |  | 3 | 2 | 0.311 |
|  |  | 4 | 11 | 0.690 |  | 4 | 3 | 0.851 |  | 4 | 2 | 0.710 |
|  |  | 5 | 14 | 0.190 |  | 5 | 4 | 0.517 |  | 5 | 3 | 0.110 |
|  |  | 6 | 16 | 0.689 |  | 6 | 5 | 0.184 |  | 6 | 3 | 0.510 |
|  |  | 7 | 19 | 0.188 |  | 7 | 5 | 0.850 |  | 7 | 3 | 0.910 |
|  |  | 8 | 21 | 0.687 |  | 8 | 6 | 0.516 |  | 8 | 4 | 0.310 |
|  |  | 9 | 24 | 0.186 |  | 9 | 7 | 0.183 |  | 9 | 4 | 0.710 |
|  |  | 10 | 26 | 0.685 |  | 19 | 7 | 0.849 |  | 10 | 5 | 0.110 |

In Table 1, the width W is 10 μm.

TABLE 2

| θ | L(μm) | Gs(μm) | Nmax | P | L(μm) | Gs(μm) | Nmax | P | L(μm) | Gs(μm) | Nmax | P |
|---|---|---|---|---|---|---|---|---|---|---|---|---|
| 2° | 4 | 0.5 | 9 | 0.222 | 7 | 0.5 | 15 | 0.221 | 2.5 | 0.5 | 21 | 0.221 |
|  |  | 1 | 5 | 0.111 |  | 1 | 8 | 0.111 |  | 1 | 11 | 0.110 |
|  |  | 1.5 | 3 | 0.741 |  | 1.5 | 5 | 0.740 |  | 1.5 | 7 | 0.740 |
|  |  | 2 | 3 | 0.055 |  | 2 | 4 | 0.555 |  | 2 | 6 | 0.055 |
|  |  | 2.5 | 2 | 0.644 |  | 2.5 | 3 | 0.844 |  | 2.5 | 5 | 0.044 |
|  |  | 3 | 2 | 0.370 |  | 3 | 3 | 0.370 |  | 3 | 4 | 0.370 |
|  |  | 3.5 | 2 | 0.175 |  | 3.5 | 3 | 0.032 |  | 3.5 | 4 | 0.889 |
|  |  | 4 | 2 | 0.028 |  | 4 | 2 | 0.778 |  | 4 | 3 | 0.528 |
|  |  | 4.5 | 1 | 0.914 |  | 4.5 | 2 | 0.580 |  | 4.5 | 3 | 0.247 |
|  |  | 5 | 1 | 0.822 |  | 5 | 2 | 0.422 |  | 5 | 3 | 0.022 |
| 5° | 4 | 0.5 | 9 | 0.552 | 7 | 0.5 | 15 | 0.550 | 2.5 | 0.5 | 21 | 0.548 |
|  |  | 1 | 5 | 0.276 |  | 1 | 8 | 0.275 |  | 1 | 11 | 0.274 |
|  |  | 1.5 | 3 | 0.851 |  | 1.5 | 5 | 0.850 |  | 1.5 | 7 | 0.849 |
|  |  | 2 | 3 | 0.138 |  | 2 | 4 | 0.638 |  | 2 | 6 | 0.137 |
|  |  | 2.5 | 2 | 0.710 |  | 2.5 | 3 | 0.910 |  | 2.5 | 5 | 0.110 |
|  |  | 3 | 2 | 0.425 |  | 3 | 3 | 0.425 |  | 3 | 4 | 0.425 |
|  |  | 3.5 | 2 | 0.222 |  | 3.5 | 3 | 0.079 |  | 3.5 | 4 | 0.935 |
|  |  | 4 | 2 | 0.069 |  | 4 | 2 | 0.819 |  | 4 | 3 | 0.568 |
|  |  | 4.5 | 1 | 0.950 |  | 4.5 | 2 | 0.617 |  | 4.5 | 3 | 0.283 |
|  |  | 5 | 1 | 0.855 |  | 5 | 2 | 0.455 |  | 5 | 3 | 0.055 |

In Table 2, the width W is 10 μm.

TABLE 3

| θ | Gs(μm) | L(μm) | Nmax | P | Gs(μm) | L(μm) | Nmax | P | Gs(μm) | L(μm) | Nmax | P |
|---|---|---|---|---|---|---|---|---|---|---|---|---|
| 0° | 0.4 | 1 | 3 | 0.500 | 1.5 | 1 | 1 | 0.667 | 2.5 | 1 | 1 | 0.400 |
|  |  | 2 | 5 | 1.000 |  | 2 | 2 | 0.333 |  | 2 | 1 | 0.800 |
|  |  | 3 | 8 | 0.500 |  | 3 | 2 | 1.000 |  | 3 | 2 | 0.200 |
|  |  | 4 | 10 | 1.000 |  | 4 | 3 | 0.667 |  | 4 | 2 | 0.600 |
|  |  | 5 | 13 | 0.500 |  | 5 | 4 | 0.333 |  | 5 | 2 | 1.000 |
|  |  | 6 | 15 | 1.000 |  | 6 | 4 | 1.000 |  | 6 | 3 | 0.400 |
|  |  | 7 | 18 | 0.500 |  | 7 | 5 | 0.667 |  | 7 | 3 | 0.800 |
|  |  | 8 | 20 | 1.000 |  | 8 | 6 | 0.333 |  | 8 | 4 | 0.200 |
|  |  | 9 | 23 | 0.500 |  | 9 | 6 | 1.000 |  | 9 | 4 | 0.600 |
|  |  | 10 | 25 | 1.000 |  | 10 | 7 | 0.667 |  | 10 | 4 | 1.000 |
|  |  | 11 | 28 | 0.500 |  | 11 | 8 | 0.333 |  | 11 | 5 | 0.400 |
|  |  | 12 | 30 | 1.000 |  | 12 | 8 | 1.000 |  | 12 | 5 | 0.800 |
|  |  | 13 | 33 | 0.500 |  | 13 | 9 | 0.667 |  | 13 | 6 | 0.200 |
|  |  | 14 | 35 | 1.000 |  | 14 | 10 | 0.333 |  | 14 | 6 | 0.600 |
|  |  | 15 | 38 | 0.500 |  | 15 | 10 | 1.000 |  | 15 | 6 | 1.000 |
|  |  | 16 | 40 | 1.000 |  | 16 | 11 | 0.667 |  | 16 | 7 | 0.400 |
|  |  | 17 | 43 | 0.500 |  | 17 | 12 | 0.333 |  | 17 | 7 | 0.800 |
|  |  | 18 | 45 | 1.000 |  | 18 | 12 | 1.000 |  | 18 | 8 | 0.200 |
|  |  | 19 | 48 | 0.500 |  | 19 | 13 | 0.667 |  | 19 | 8 | 0.600 |
|  |  | 20 | 50 | 1.000 |  | 20 | 14 | 0.333 |  | 20 | 8 | 1.000 |

In Table 3, the tilt angle θ is 0°. It is understood that when a ratio of the length of the active channel region with respect to the maximum number of the primary boundaries is equal to a grain size, the probability P is 1.

TABLE 4

| θ | L(μm) | Gs(μm) | Nmax | P | L(μm) | Gs(μm) | Nmax | P | L(μm) | Gs(μm) | Nmax | P |
|---|---|---|---|---|---|---|---|---|---|---|---|---|
| 0° | 4 | 0.5 | 8 | 1.000 | 7 | 0.5 | 14 | 1.000 | 10 | 0.5 | 20 | 1.000 |
|  |  | 1 | 4 | 1.000 |  | 1 | 7 | 1.000 |  | 1 | 10 | 1.000 |
|  |  | 1.5 | 3 | 0.667 |  | 1.5 | 5 | 0.667 |  | 1.5 | 7 | 0.667 |
|  |  | 2 | 2 | 1.000 |  | 2 | 4 | 0.500 |  | 2 | 5 | 1.000 |
|  |  | 2.5 | 2 | 0.600 |  | 2.5 | 3 | 0.800 |  | 2.5 | 4 | 1.000 |
|  |  | 3 | 2 | 0.333 |  | 3 | 3 | 0.333 |  | 3 | 4 | 0.333 |
|  |  | 3.5 | 2 | 0.143 |  | 3.5 | 2 | 1.000 |  | 3.5 | 3 | 0.857 |
|  |  | 4 | 1 | 1.000 |  | 4 | 2 | 0.750 |  | 4 | 3 | 0.500 |
|  |  | 4.5 | 1 | 0.889 |  | 4.5 | 2 | 0.556 |  | 4.5 | 3 | 0.222 |
|  |  | 5 | 1 | 0.800 |  | 5 | 2 | 0.400 |  | 5 | 2 | 1.000 |
|  |  | 5.5 | 1 | 0.727 |  | 5.5 | 2 | 0.273 |  | 5.5 | 2 | 0.818 |
|  |  | 6 | 1 | 0.667 |  | 6 | 2 | 0.167 |  | 6 | 2 | 0.667 |
|  |  | 6.5 | 1 | 0.615 |  | 6.5 | 2 | 0.077 |  | 6.5 | 2 | 0.538 |
|  |  | 7 | 1 | 0.571 |  | 7 | 1 | 1.000 |  | 7 | 2 | 0.429 |
|  |  | 7.5 | 1 | 0.533 |  | 7.5 | 1 | 0.933 |  | 7.5 | 2 | 0.333 |
|  |  | 8 | 1 | 0.500 |  | 8 | 1 | 0.875 |  | 8 | 2 | 0.250 |
|  |  | 8.5 | 1 | 0.471 |  | 8.5 | 1 | 0.824 |  | 8.5 | 2 | 0.176 |
|  |  | 9 | 1 | 0.444 |  | 9 | 1 | 0.778 |  | 9 | 2 | 0.111 |
|  |  | 9.5 | 1 | 0.421 |  | 9.5 | 1 | 0.737 |  | 9.5 | 2 | 0.053 |
|  |  | 10 | 1 | 0.400 |  | 10 | 1 | 0.700 |  | 10 | 1 | 1.000 |

In Table 4, the tilt angle θ is 0°. It is understood that when the maximum number of the primary boundaries is equal to the length of the active channel divided by the grain size, the probability P is 1.

As described previously, the TFTs having uniform characteristics can be manufactured by setting parameters such as a grain size, a tilt angle of a grain boundary, and a dimension of an active channel region according to the probability.

Although a few embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A poly-silicon layer of a thin film transistor (TFT), comprising:
   an active channel region,
   wherein a probability P that a maximum number of primary grain boundaries exists on the active channel region is not 0.5, the probability P obtained by the following equation:

$$P = \frac{D - (N\max - 1) \cdot Gs}{Gs},$$

where $D = L \cdot \cos\theta + W \cdot \sin\theta$, L is a channel length of the active channel region, W is a width of the active channel region, Nmax is the maximum number of the primary boundaries existing on the active channel region, Gs is a grain size, and θ is a tilt angle of the primary grain boundaries.

2. The poly-silicon layer according to claim 1, wherein the poly-silicon layer is used in a TFT arranged in a display region.

3. The poly-silicon layer according to claim 1, wherein the poly-silicon layer is used in a TFT arranged in a driving circuit portion.

4. The poly-silicon layer according to claim 1, where P is more than 0.75 or less than 0.25.

5. The poly-silicon layer according to claim 1, wherein θ is $-45° \leq \theta \leq 45°$.

6. The poly-silicon layer according to claim 1, wherein the grain size is more than 0.2 μm.

7. The poly-silicon layer according to claim 1, wherein the number of grains is two or more.

8. The poly-silicon layer according to claim 1, wherein a probability Q that (Nmax−1) primary grain boundaries exist on the active channel region is defined: Q=1−P.

9. The poly-silicon layer according to claim 1, wherein Nmax=$\xi$(D/Gs), where $\xi$ (x) is the smallest integer among numbers $\geq x$, and "x" is an arbitrary number.

10. The poly-silicon layer according to claim 1, wherein Nmax is one of 1 to 10.

11. The poly-silicon layer according to claim 1, wherein when θ is 0°, a ratio of the length of the active channel region with respect to Nmax is equal to the grain size.

12. The poly-silicon layer according to claim 1, wherein when θ is 0°, the length of the active channel region is equal to the grain size by Nmax.

13. A poly-silicon layer of a thin film transistor (TFT), comprising:
    an active channel region,
    wherein a length of the active channel region is an integer multiple of a grain size between primary boundaries.

14. The poly-silicon layer according to claim 13, wherein the poly-silicon layer is used in a TFT arranged in a display region.

15. The poly-silicon layer according to claim 13, wherein the poly-silicon layer is used in a TFT arranged in a driving circuit portion.

16. The poly-silicon layer according to claim 13, wherein the length of the active channel region is more than 2 μm.

17. The poly-silicon layer according to claim 13, wherein the number of grains is two or more.

18. The poly-silicon layer according to claim 13, wherein a grain size is more than 2 μm.

19. A poly-silicon layer of a thin film transistor (TFT), comprising:
    an active channel region,
    wherein a probability P that a maximum number of primary grain boundaries exists on the active channel region is defined as a ratio of the distance in which the length of the active channel in the logitudinal direction of grains minus a distance that a "maximum number—

1" primary grain boundaries occupy, to the longitudinal length of the grains, and the probability is not 0.5.

20. The poly-silicon layer according to claim 19, wherein the poly-silicon layer is used in a TFT arranged in a display region.

21. The poly-silicon layer according to claim 19, wherein the poly-silicon layer is used in a TFT arranged in a driving circuit portion.

22. The poly-silicon layer according to claim 19, wherein the probability P is more than 0.75 or less than 0.25.

23. The poly-silicon layer according to claim 19, wherein a length of the active channel region is an integer multiple of a grain size.

24. The poly-silicon layer according to claim 19, wherein a grain grows in a constant direction.

25. The poly-silicon layer according to claim 19, wherein a grain size is more than 2 $\mu$m.

26. The poly-silicon layer according to claim 19, wherein a maximum number of the grain boundaries is one of 1 to 10.

27. The poly-silicon layer according to claim 19, wherein the length of the active channel region is more than 2 $\mu$m.

28. The poly-silicon layer according to claim 19, wherein the number of grains is two or more.

29. A device comprising:

a thin film transistor having a poly-silicon layer, wherein said poly-silicon layer includes an active channel region, wherein a probability P that a maximum number of primary grain boundaries exists on the active channel region is not 0.5, the probability P obtained by the following equation:

$$P = \frac{D - (N\max - 1) \cdot Gs}{Gs},$$

where $D = L \cdot \cos \theta + W \cdot \sin \theta$, L is a channel length of the active channel region, W is a width of the active channel region, Nmax is the maximum number of the primary boundaries existing on the active channel region, Gs is a grain size, and $\theta$ is a tilt angle of the primary grain boundaries.

30. The device according to claim 29, wherein said device is a display device or a semiconductor device.

31. The device according to claim 30, wherein said display device comprises one of a liquid display (LCD) device and an organic EL display device.

32. A display device having multiple TFTs, comprising:

a TFT having a poly-silicon layer with an active channel region having at least one primary boundary associated therewith, such that primary boundaries with a same number for the active channel region as compared with the other multiple TFTs of the display device is dominant throughout the display device;

wherein the TFTs are manufactured by setting parameters of grain size, a tilt angle of a grain boundary, and a dimension of the active channel region.

33. The display device according to claim 32, wherein the percentage of primary boundaries among the display device with the same number of boundaries is more than 75%.

34. The display device according to claim 32, wherein a maximum number of grain boundaries is between 1 to 10.

35. The display device according to claim 32, wherein the grain size is more than 0.2 $\mu$m.

36. The display device according to claim 32, wherein the number of grains is two or more.

* * * * *

UNITED STATES PATENT AND TRADEMARK OFFICE
CERTIFICATE OF CORRECTION

PATENT NO. : 6,759,679 B2
DATED : July 6, 2004
INVENTOR(S) : Ki-Yong Lee It is certified that error appears in the above-identified patent and that said Letters Patent is hereby corrected as shown below:

Column 10,
Line 48, insert -- grain -- before "boundaries"

Signed and Sealed this

Twenty-sixth Day of April, 2005

JON W. DUDAS
*Director of the United States Patent and Trademark Office*